United States Patent [19]
Wu

[11] Patent Number: 6,008,514
[45] Date of Patent: Dec. 28, 1999

[54] DOUBLE-CROWN SHAPE CAPACITOR WITH HIGH-DIELECTRIC CONSTANT MATERIAL

[76] Inventor: Shye-Lin Wu, No. 6, Creation Rd. 2, Science-Based Industrial Park, Hsinchu, Taiwan

[21] Appl. No.: 09/300,638

[22] Filed: Apr. 27, 1999

Related U.S. Application Data

[63] Continuation-in-part of application No. 09/025,970, Feb. 19, 1998.

[51] Int. Cl.$^6$ .................................................. H01L 27/108
[52] U.S. Cl. .......................................... 257/308; 257/309
[58] Field of Search .................................... 257/306–309, 257/534

[56] References Cited

U.S. PATENT DOCUMENTS 5,274,258  12/1993  Ahn .......................................... 257/309
5,753,949   5/1998  Honma et al. ........................... 257/309

OTHER PUBLICATIONS

Kaga et al., "Crown–Shaped Stacked–Capacitor Cell for 1.5–V Operation 64–Mb DRAM's" IEEE Transactions on Electron Devices, vol. 38, No. 2, Feb. 1991, p. 255–261.

*Primary Examiner*—David B. Hardy
*Attorney, Agent, or Firm*—Harness, Dickey & Pierce, P.L.C.

[57] ABSTRACT

A double-crown shaped capacitor of a dynamic random access memory cell is disclosed. The capacitor includes a first crown-shaped conductive region formed over a semiconductor substrate, wherein the first crown-shaped conductive region communicates to the semiconductor substrate via a hole. The capacitor also includes a second crown-shaped conductive region formed over the semiconductor substrate, wherein the inner sidewall of the second crown-shaped conductive region abuts on the outer sidewall of said first crown-shaped conductive region. Finally, the capacitor includes a dielectric layer covering the first crown-shaped conductive region and the second crown-shaped conductive region, and includes a conductive layer (138) formed on the dielectric layer.

18 Claims, 11 Drawing Sheets

DOUBLE-CROWN SHAPE CAPACITOR WITH HIGH-DIELECTRIC CONSTANT MATERIAL

The present invention is a continuation-in-part application of U.S. patent application Ser. No. 09/025,970, filed Feb. 19, 1998.

BACKGROUND OF THE PRESENT INVENTION

Field of the Invention

Description of the Prior Art

Figure 1:
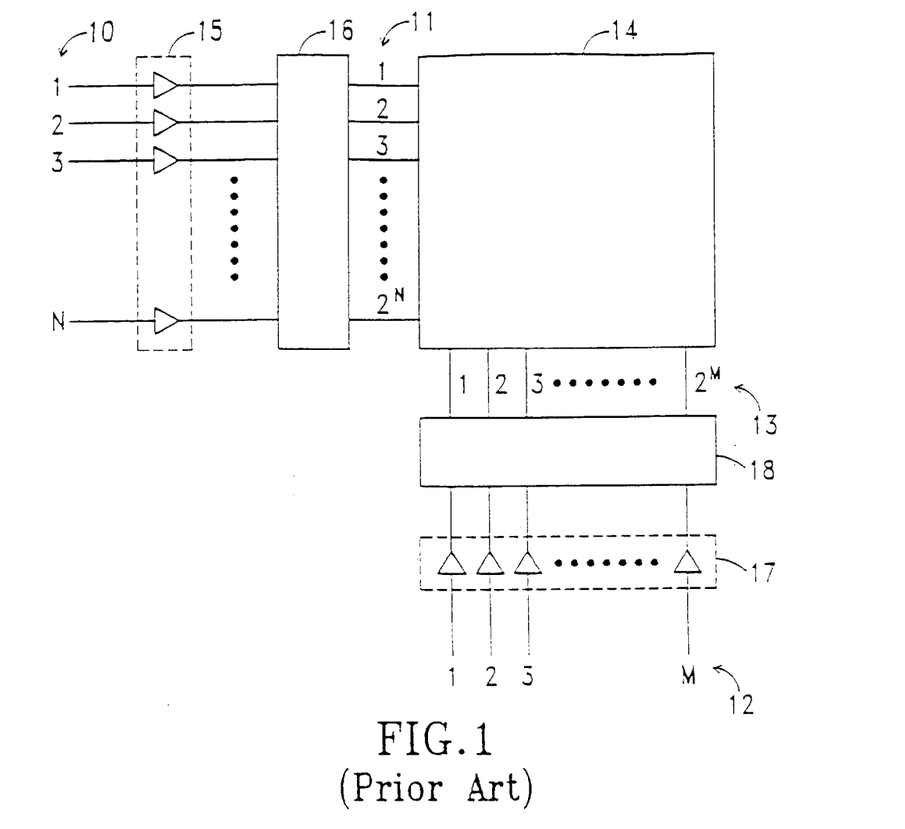
FIG. 1 shows a simplified diagram illustrative of the organization of a typical large semiconductor memory.

The increasing popularity of electronic equipment, such as computers for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use concerning reading and writing operations.

Figure 2A:
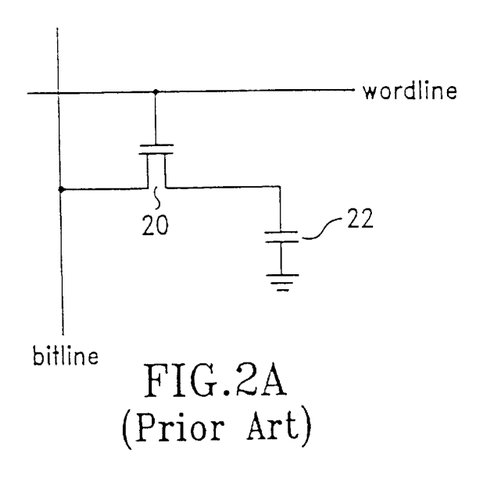
FIG. 2A shows a circuit schematic diagram of a typical one-transistor dynamic random access memory (DRAM) cell.
Figure 2B:
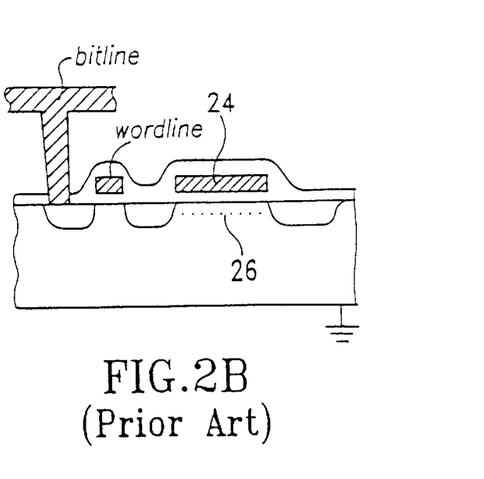
FIG. 2B shows a cross-sectional view illustrative of traditional one-transistor DRAM storage cell.

Early DRAMs used storage cells each consisting of three transistors and were manufactured using P type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

In IEDM 98, on pages 30.1.1–30.1.4, an article entitled "(Ba, Sr)TiO$_3$ Capacitor Technology for Gbit-Scale DRAMs" was published. In this article, K. Ono et al. disclosed a Pt/BST/Pt capacitor structure and an issue to be further addressed for application of BST capacitors to 4-Gbit-scale DRAMs and beyond may be the improvement of coverage properties of BST films and cell-plate metals to uniformly deposit them onto higher sidewalls in the smaller spacing between storage nodes, as can be seen in FIG. 10 according to the article.

In IEDM 98, on pages 30.2.1–30.2.4, a paper was published and it is entitled "All Perovskite Capacitor (APEC) Technology for (Ba, Sr)TiO$_3$ Capacitor scaling toward 0.10 um Stacked DRAMs". The authors, K. Hieda et al., teach All perovskite Capacitor (APEC) technology to fabricate (Ba, Sr)TiO3 (BST) capacitor in 0.10 μm DRAM generation. A conductive perovskite-oxide (polycrystalline SrRuO3 (SRO)) electrode was introduced as a bottom and a top electrode of BST capacitor in this paper.

In IEDM 98, on pages 30.4.1–30.4.4, Byoung Tael Lee et al. published a paper entitled "Integration Processes of (Ba, Sr)TiO3 Capacitor for 1 Gb and Beyond". The authors of the paper introduce a new two-step post-annealing process to prevent degradation of integrated BST capacitors. Besides, the increment of capacitance and the reduction of leakage current were obtained without barrier oxidation. A concave-type capacitor structure with buried barrier using Pt electrodes and MOCVD BST films was demonstrated in order to solve the integration problem such as Pt etching and the contact between the BST and the barrier.

In IEDM 97, on pages 25.4.1–25.4.4, a paper entitled "A High Stability Electrode Technology for Stacked SrBi$_2$Ta$_2$O$_9$ Capacitors Applicable to Advanced Ferroelectric Memory" was published. The authors of this paper proposed a novel high stability electrode technology with TaSiN as a key ingredient to fabricate the stacked BST capacitors on polySi plug.

In IEDM 96, on pages 22.2.1–22.2.4, J. Y. Lee et al. published an article entitled "Simultaneously Formed Storage Node Contact and Metal Contact Cell (SSMC) for 1 Gb DRAM and Beyond". In this paper, a new Simultaneously formed Storage Node contact and Metal Contact Cell (SSMC) has been developed with 0.18 μm design rule for 1 Gb DRAM and beyond. In SSMC, parasitic storage node contact resistance between storage node and cell transistor can be greatly reduced by forming low resistance W-plug in storage node contact hole.

In IEDM 96, on pages 27.1.1–27.1.4, H. Yamaguchi et al. proposed a paper entitled "A Stacked Capacitor with an MOCVD-(Ba, Sr)TiO3 Film and a RuO2/Ru Storage Node on a TiN-capped Plug for 4 Gbit DRAMs and beyond". A capacitor with a 550° C.-process-tolerant RuO$_2$/Ru storage node on a TiN-capped plug and with a small teq ECR-plasma MOCVD BST thin film is developed in this article.

In IEDM 96, on pages 27.3.1–27.3.4, Myoung-Bum Lee et al. proposed a paper entitled "Electrical Characterization of CVD TiN Upper Electrode for Ta$_2$O$_5$ Capacitor". The authors introduced CVD TiN, using TiCl4 and NH3 as reactants, is an excellent barrier in poly-Si/TiN double electrode of Ta2O5 capacitor in terms of electrical characteristics as well as film conformality.

SUMMARY OF THE PRESENT INVENTION

In accordance with the first preferred embodiment of the present invention, a double-crown shaped capacitor of a dynamic random access memory cell is disclosed that substantially increases the surface of the capacitor. In one embodiment, the capacitor includes a first dielectric layer formed on a semiconductor substrate, and a silicon oxide layer formed on the first dielectric layer. The capacitor also includes a first crown-shaped doped polysilicon region formed over the semiconductor substrate, wherein the first crown-shaped doped polysilicon region communicates to the semiconductor substrate via a hole in the first dielectric layer and the silicon oxide layer. Further, the capacitor includes a second crown-shaped doped polysilicon region formed over the silicon oxide layer, wherein the inner sidewall of the second crown-shaped doped polysilicon region abuts on the outer sidewall of the first crown-shaped doped polysilicon region. Finally, a second dielectric layer covers the first crown-shaped doped polysilicon region and the second crown-shaped doped polysilicon region, and a conductive layer is formed on the dielectric layer.

In accordance with the second preferred embodiment of the present invention, a double-crown shaped capacitor of a dynamic random access memory cell is disclosed that substantially increases the surface of the capacitor. The capacitor includes a first dielectric layer formed on a semiconductor substrate, and a silicon oxide layer formed on the first dielectric layer. The capacitor also includes a first crown-shaped metal region formed over the semiconductor substrate, wherein the first crown-shaped metal region communicates to the semiconductor substrate via a conductive plug in a hole in the first dielectric layer and the silicon oxide layer. Further, the capacitor includes a second crown-shaped metal region formed over the silicon oxide layer, wherein the inner sidewall of the second crown-shaped metal region abuts on the outer sidewall of the first crown-shaped metal region. Finally, a second dielectric layer covers the first crown-shaped metal region and the second crown-shaped metal region, and a conductive layer is formed on the dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

The present invention discloses two preferred embodiments for fabricating a capacitor on a substrate. First, the first embodiment of the present invention is explained in the following descriptions. A capacitor of a dynamic random access memory cell, the capacitor comprising a first crown-shaped doped polysilicon region formed over a semiconductor substrate, the first crown-shaped doped polysilicon region communicating to said semiconductor substrate; a second crown-shaped doped polysilicon region formed over the semiconductor substrate, an inner sidewall of the second crown-shaped doped polysilicon region abutting on an outer sidewall of the first crown-shaped doped polysilicon region; a dielectric layer covering the first crown-shaped doped polysilicon region and the second crown-shaped doped polysilicon region; and a conductive layer formed on the dielectric layer.

Figure 3:
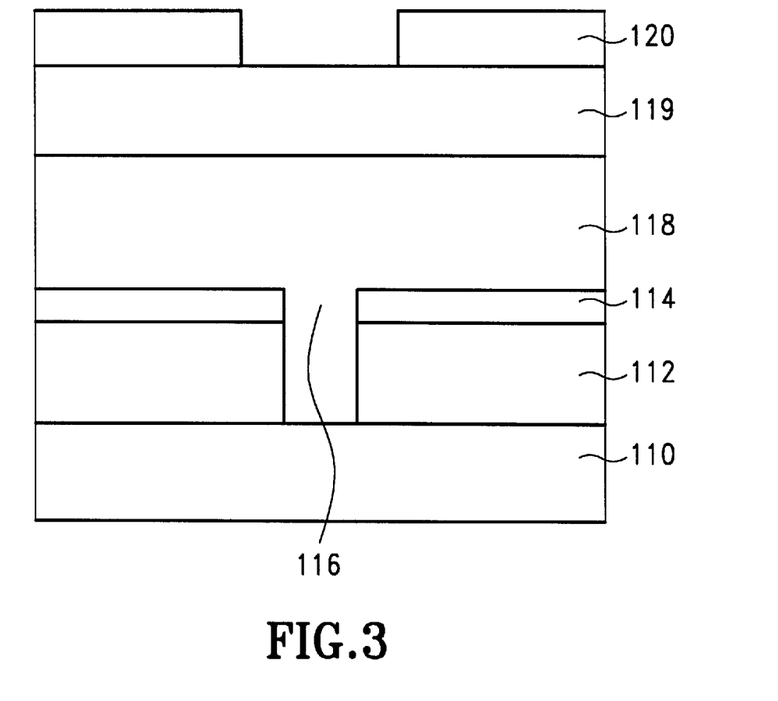
FIGS. 3–11 show cross-sectional views illustrative of various stages in the fabrication of a DRAM capacitor in accordance with the first embodiment of the present invention.

FIG. 3 shows a cross-sectional view illustrative of a portion of a dynamic random access memory (DRAM) cell in accordance with one embodiment of the present invention, wherein a dielectric layer 112, such as tetraethylorthosilicate (TEOS) or boro-phosphosilicate glass (BPSG), is deposited on a semiconductor substrate 110. A silicon oxide layer 114 is then deposited on the dielectric layer 112. In this embodiment, this silicon oxide layer 114 is deposited using a conventional low-pressure chemical vapor deposition (LPCVD) or plasma enhanced chemical vapor deposition (PECVD) process. The thickness of this silicon oxide layer 114 can range from about 1000 to 10000 angstroms. It is noted that a contact hole 116 is also formed in the silicon oxide layer 114 and the dielectric layer 112 so that a portion of the substrate 110, such as a source region, is exposed.

A doped polysilicon layer 118 is then formed on the silicon oxide layer 114, therefore filling the contact hole 116. In this embodiment, the polysilicon layer 118 is deposited using a standard chemical vapor deposition process to a thickness of about 3000–6000 angstroms above the surface of the silicon oxide layer 114. Another silicon oxide layer 119 is formed on the doped polysilicon layer 118. In this embodiment, the silicon oxide layer 119 is preferably formed in the same manner as the silicon oxide layer 114, and has a thickness of about 1000–10000 angstroms.

Figure 4:
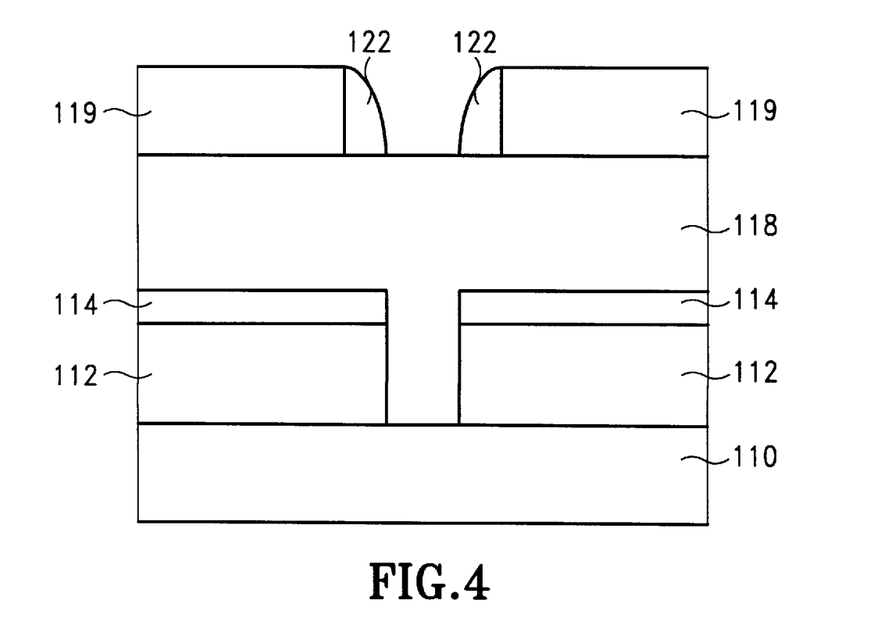

A photoresist layer 120 is then formed and patterned on the silicon oxide layer 119 using conventional photolithographic techniques, defining a storage node region in the silicon oxide layer 119 as shown in FIG. 4.

Next, a silicon nitride spacer 122 is formed on the sidewall of the silicon oxide layer 119. This silicon nitride spacer 122 is preferably formed by firstly blanket depositing a silicon nitride layer 122 over the silicon oxide layer 119, followed by etching back to form the silicon nitride spacer 122. In this embodiment, the silicon nitride layer 122 is deposited using a conventional low-pressure chemical vapor deposition (LPCVD) or plasma enhanced chemical vapor deposition (PECVD).

Figure 5:
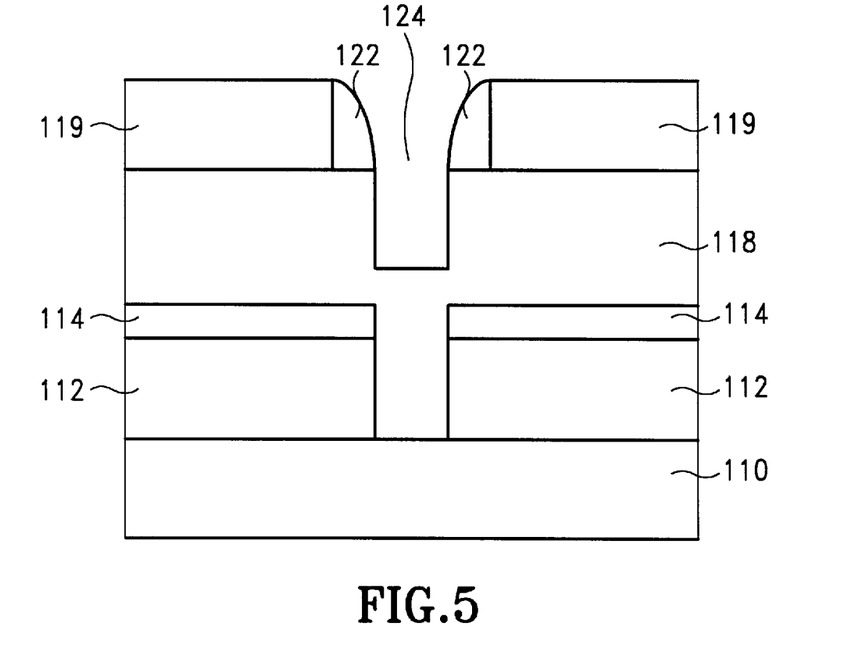

Referring to FIG. 5, the doped polysilicon layer 118 is recessed by etching a portion thereof using the silicon nitride spacer 122 and the silicon oxide layer 119 as a mask, thereby forming a recessed cavity 124 in the doped polysilicon layer 118.

Figure 6:
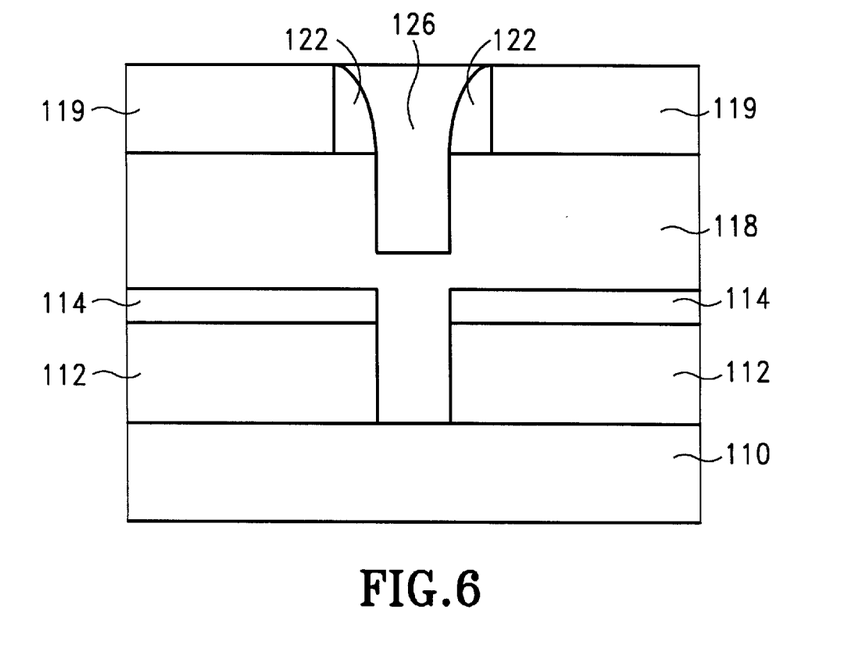

Turning to FIG. 6, another silicon nitride layer 126 is formed to refill the cavity 124 in the doped polysilicon layer 118, and also refill the hole surrounded by the silicon nitride spacer 122. This silicon nitride layer 126 is preferably formed in the same manner as the silicon nitride spacer 122.

Figure 7:
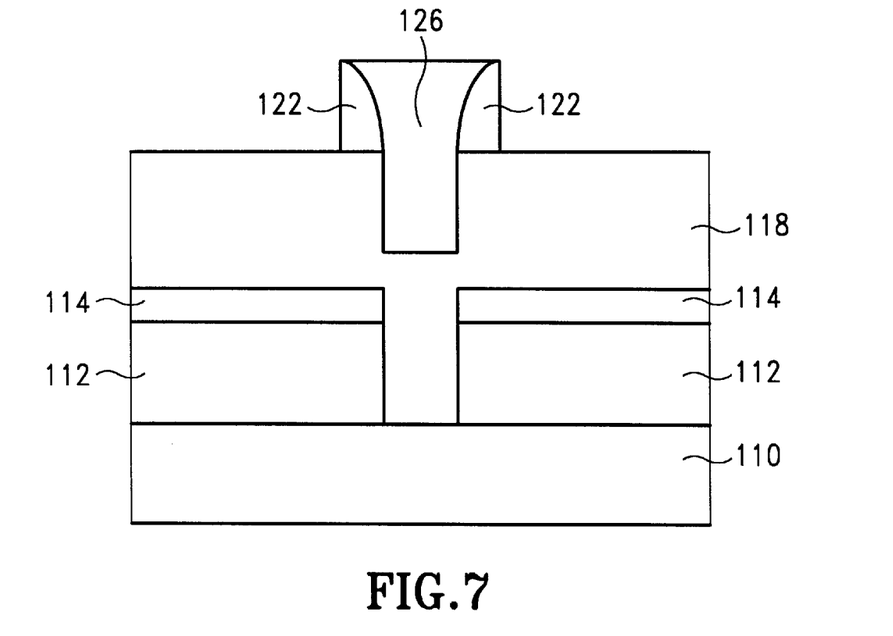

Thereafter, the silicon oxide layer 119 is removed to expose the doped polysilicon layer 118 by using the silicon nitride layer 126 and the silicon nitride spacer 122 as an etch mask as shown in FIG. 7. In this etching, a wet etchant such as diluted hydrofluoric (HF) solution is used because it has the advantage of dissolving silicon oxide without attacking silicon nitride and polysiliocn. Preferably, the HF is mixed with ammonium fluoride ($NH_4F$), known as a buffered oxide etch (BOE), to slow down the etch rate into a more controllable process.

Figure 8:
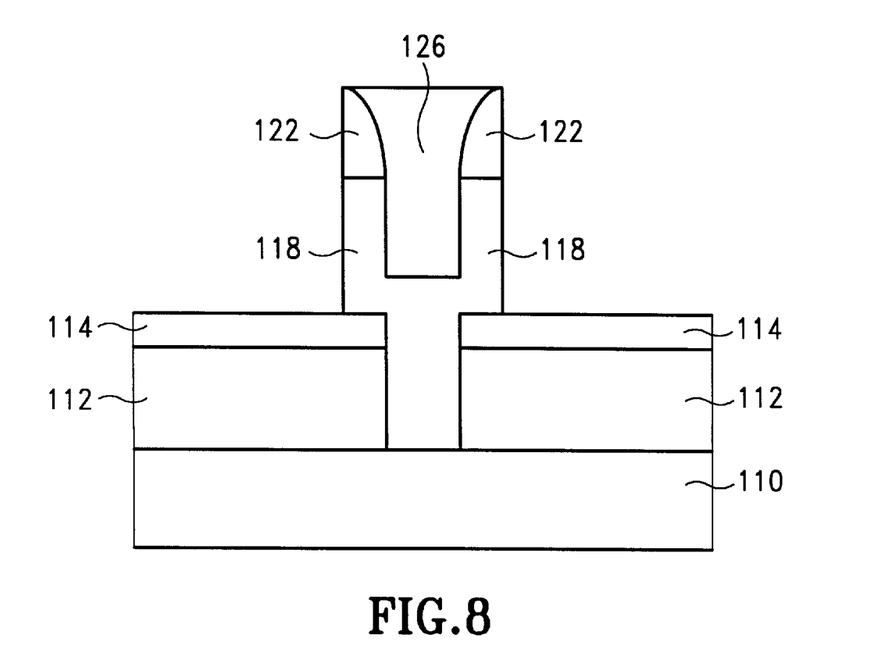

Furthermore, the doped polysilicon layer 118 is etched back to expose the silicon oxide layer 114 by using the silicon nitride layer 126 and the silicon nitride spacer 122 as an etch mask as shown in FIG. 8.

Figure 9:
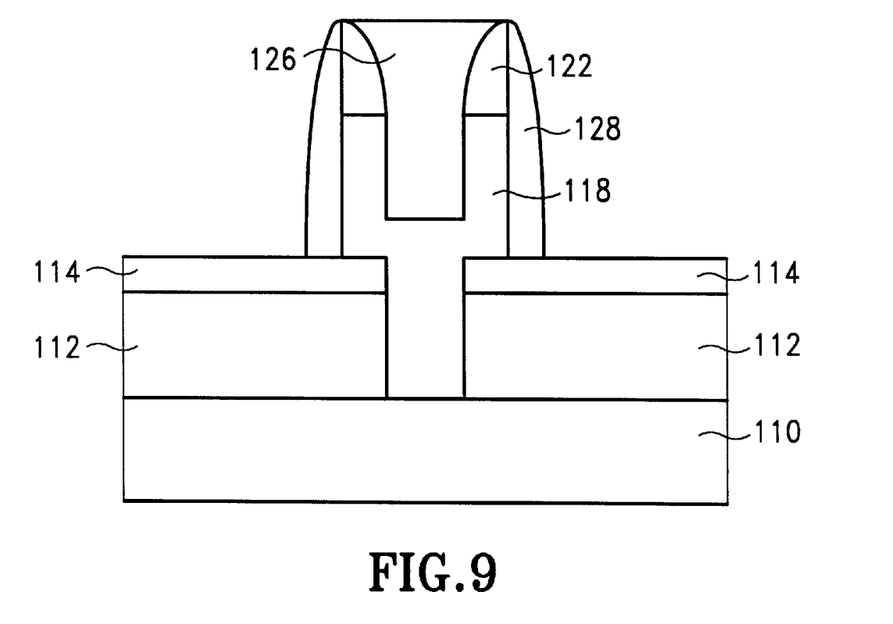

Referring to FIG. 9, a doped polysiliocn spacer 128 is formed on the sidewalls of the silicon nitride spacer 122 and the doped polysilicon layer 118. This doped polysiliocn spacer 128 is preferably formed by firstly blanket depositing a doped polysiliocn layer 128 on the silicon nitride layer 126 and the silicon oxide layer 114, followed by etching back to form the doped polysiliocn spacer 128.

Figure 10:
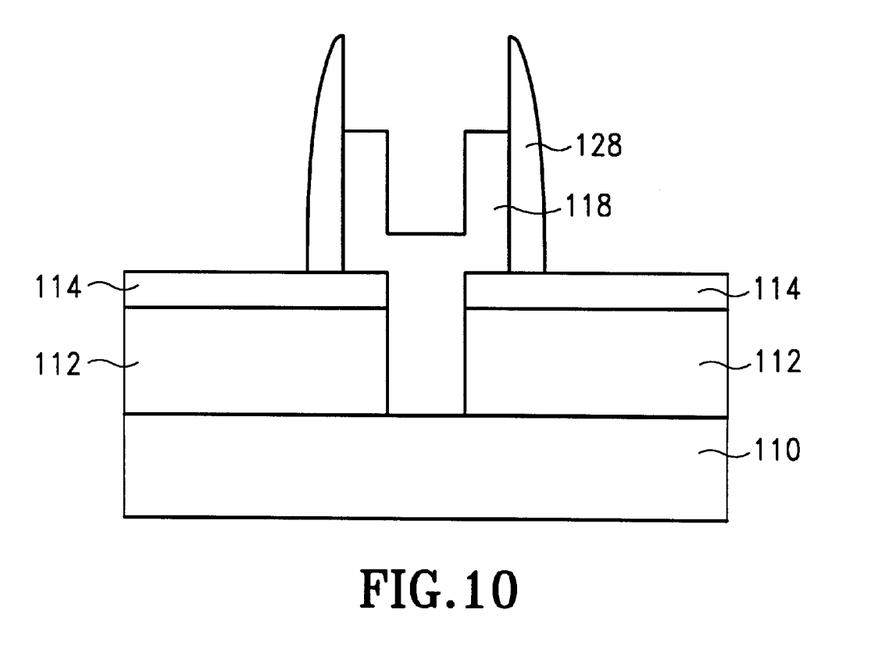

After removing the silicon nitride layer 126 and the silicon nitride spacer 122, for example, by hot phosphoric acid ($H_3PO_4$) solution, a double-crown shaped bottom electrode of the DRAM cell is thus formed as shown in FIG. 10.

Figure 11:
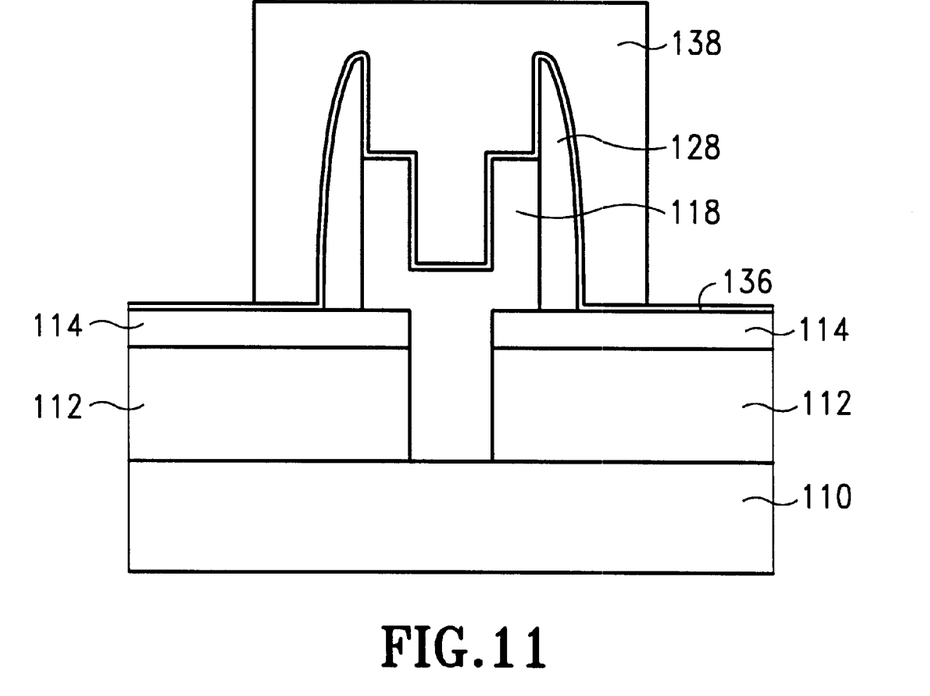

Referring to FIG. 11, a dielectric film 136 and a top electrode 138 of the DRAM cell capacitor can then be formed in the conventional manner. In this embodiment, a thin dielectric layer 136, such as stacked oxide-nitride-oxide (ONO) film, is formed on the exposed surface of the bottom electrode (i.e., the storage node 118 and 128) and the surface of the silicon oxide layer 114. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. Other material, such as NO, $Ta_2O_5$, $TiO_2$, PZT, or BST can be used as the thin dielectric layer 136. A conductive layer 138 is then deposited over the stack oxide/silicon nitride/oxide layer 136 to serve as an upper plate of the DRAM cell capacitor. Typically, the conductive layer 138 is a doped polysilicon layer formed in the same manner as the polysilicon layer 118. Other material, such as metal or silicide, can be used as the conductive layer 138.

In the following descriptions, the second preferred embodiment would be explained in reference with FIGS. 12–20. The second preferred embodiment is the modified embodiment of the first preferred embodiment.

Figure 12:
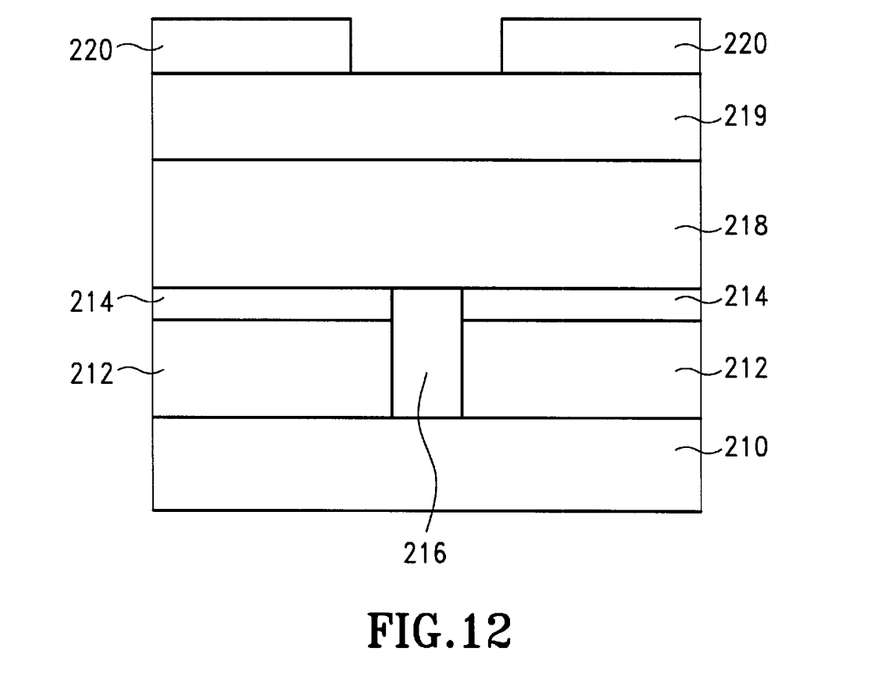
FIGS. 12–20 show cross-sectional views illustrative of various stages in the fabrication of a DRAM capacitor in accordance with the second embodiment of the present invention.

FIG. 12 shows a cross-sectional view illustrative of a portion of a dynamic random access memory (DRAM) cell in accordance with one embodiment of the present invention, wherein a dielectric layer 212, such as tetraethylorthosilicate (TEOS) or boro-phosphosilicate glass (BPSG), is deposited on a semiconductor substrate 210. A silicon oxide layer 214 is then deposited on the dielectric layer 212. In this embodiment, this silicon oxide layer 214 is deposited using a conventional low-pressure chemical vapor deposition (LPCVD) or plasma enhanced chemical vapor deposition (PECVD) process. The thickness of this silicon oxide layer 214 can range from about 1000 to 10000 angstroms. It is noted that a contact hole is also formed in the silicon oxide layer 214 and the dielectric layer 212 so that a portion of the substrate 210, such as a source region, is exposed.

Referring to FIG. 12 again, a plug 216 is formed in the contact hole in the silicon oxide 214 and the dielectric layer 212. The plug 216 is formed of polysilicon material or tungsten material and it serves as a conductive layer of the substrate 210. While the plug 216 is formed of tungsten material, it is necessary that a barrier layer is formed between the plug 216 and the dielectric layer 212, between the plug 216 and the silicon oxide layer 214. In a case, the barrier layer is formed of material selected from metal titanium (Ti) and titanium nitride (TiN).

A conductive layer 218 is then formed on the silicon oxide layer 214 and the plug 216. In the second preferred embodiment, the conductive layer 218 is deposited using a standard process to a thickness of about 3000–6000 angstroms above the surface of the silicon oxide layer 214 and the plug 216. In the preferred embodiment, the conductive layer 218 is formed of W, TiN, $RuO_2$ or WN. Another silicon oxide layer 219 is formed on the conductive layer 218. In this embodiment, the silicon oxide layer 219 is preferably formed in the same manner as the silicon oxide layer 214, and has a thickness of about 1000–10000 angstroms.

A photoresist layer 220 is then formed and patterned on the silicon oxide layer 219 using conventional photolithographic techniques, defining a storage node region in the silicon oxide layer 219 as shown in FIG. 12.

Figure 13:
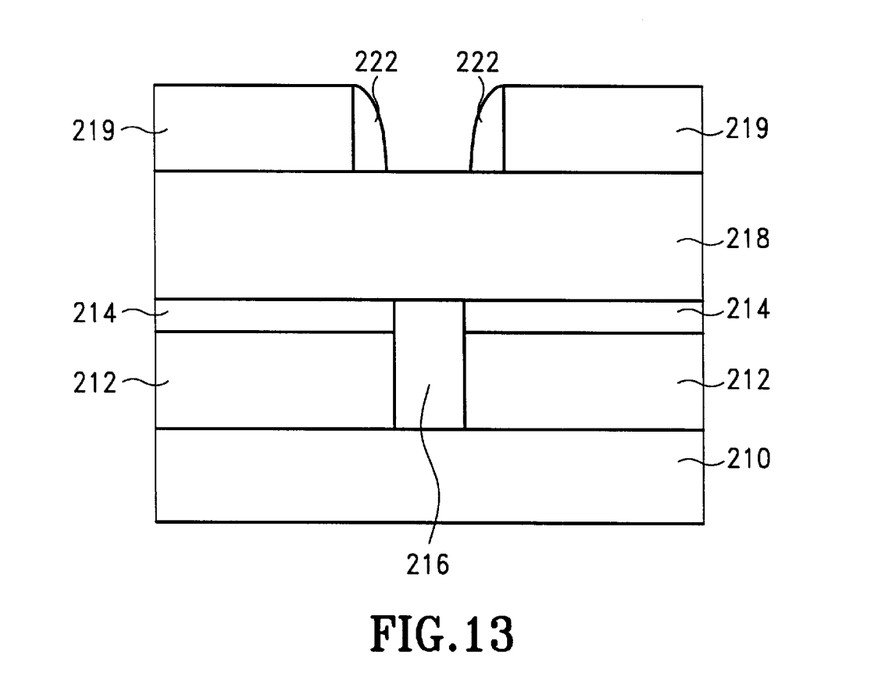

Referring to FIG. 13, a silicon nitride spacer 222 is formed on the sidewall of the silicon oxide layer 219. This silicon nitride spacer 222 is preferably formed by firstly blanket depositing a silicon nitride layer 222 over the silicon oxide layer 219, followed by etching back to form the silicon nitride spacer 222. In this embodiment, the silicon nitride layer 222 is deposited using a conventional low-pressure chemical vapor deposition (LPCVD) or plasma enhanced chemical vapor deposition (PECVD).

Figure 14:
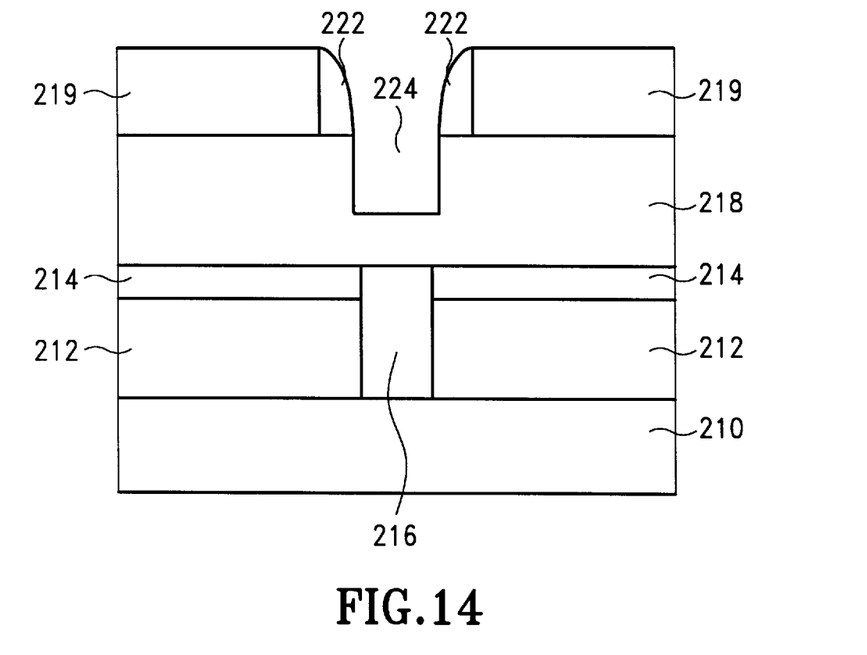

Referring to FIG. 14, the conductive layer 218 is recessed by etching a portion thereof using the silicon nitride spacer 222 and the silicon oxide layer 219 as a mask, thereby forming a recessed cavity 224 in the conductive layer 218.

Figure 15:
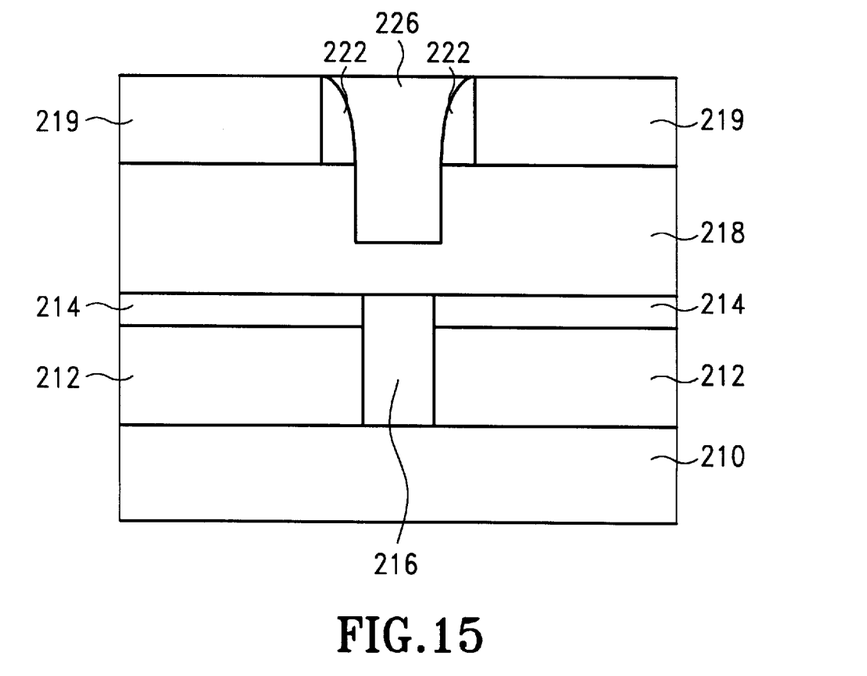

Turning to FIG. 15, another silicon nitride layer 226 is formed to refill the cavity 224 in the conductive layer 218, and also refill the hole surrounded by the silicon nitride spacer 222. This silicon nitride layer 226 is preferably formed in the same manner as the silicon nitride spacer 222.

Figure 16:
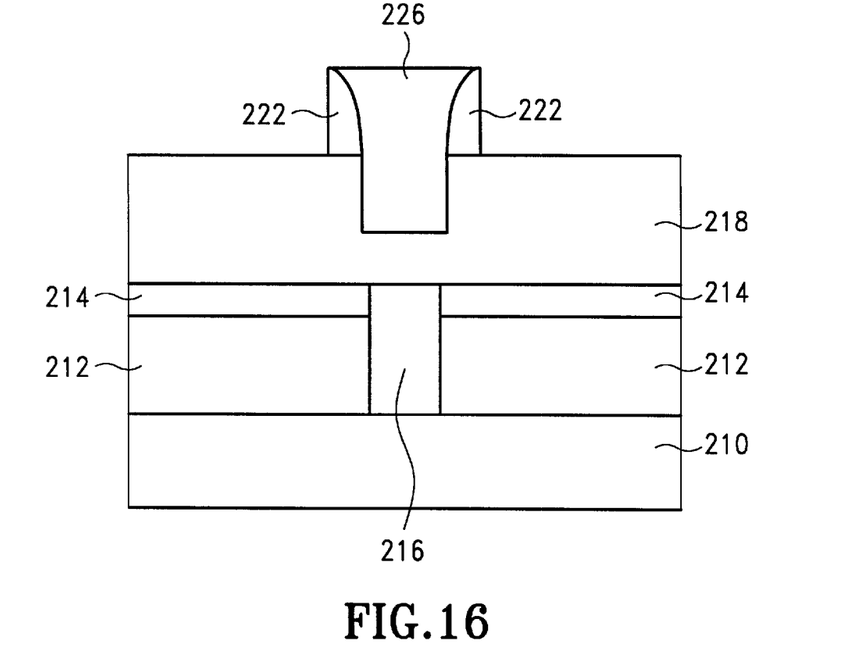

Referring to FIG. 16, the silicon oxide layer 219 is removed to expose the conductive layer 218 by using the silicon nitride layer 226 and the silicon nitride spacer 222 as an etch mask. In this etching, a wet etchant such as diluted hydrofluoric (HF) solution is used because it has the advantage of dissolving silicon oxide without attacking silicon nitride and polysiliocn. Preferably, the HF is mixed with ammonium fluoride (NH4F), known as a buffered oxide etch (BOE), to slow down the etch rate into a more controllable process.

Figure 17:
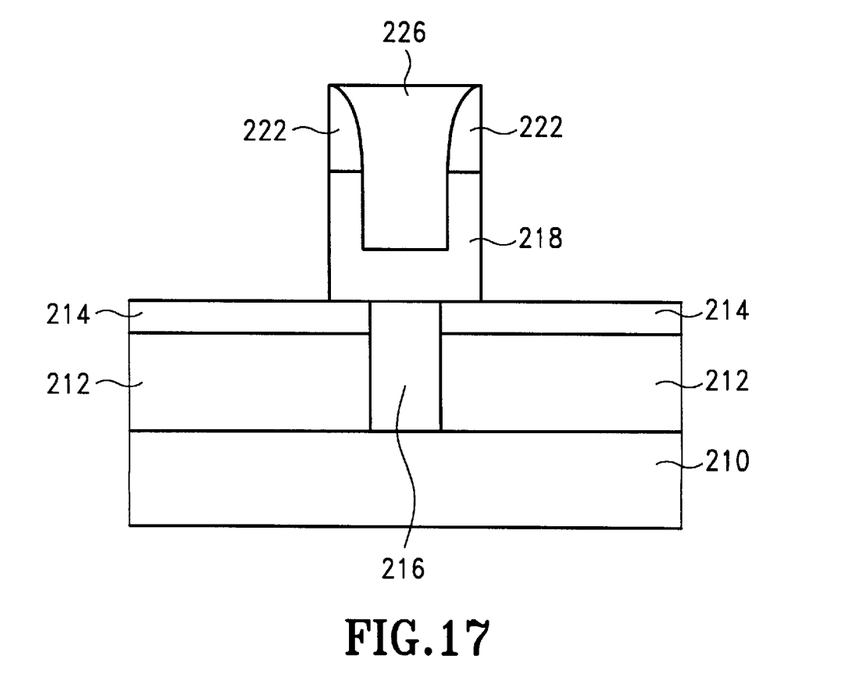

Referring to FIG. 17, the conductive layer 218 is etched back to expose the silicon oxide layer 214 by using the silicon nitride layer 226 and the silicon nitride spacer 222 as an etch mask.

Figure 18:
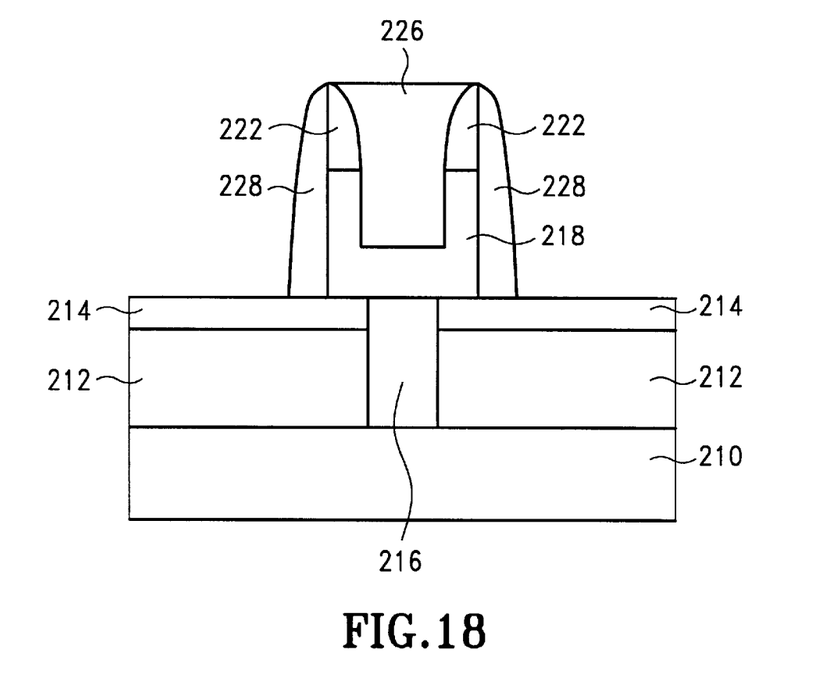

Referring to FIG. 18, a conductive spacer 228 is formed on the sidewalls of the silicon nitride spacer 222 and the conductive layer 218. This conductive spacer 228 is preferably formed by firstly blanket depositing a conductive layer 228 on the silicon nitride layer 226 and the silicon oxide layer 214, followed by etching back to form the conductive spacer 228. In a case, the conductive spacer 228 is formed of W, TiN or WN.

Figure 19:
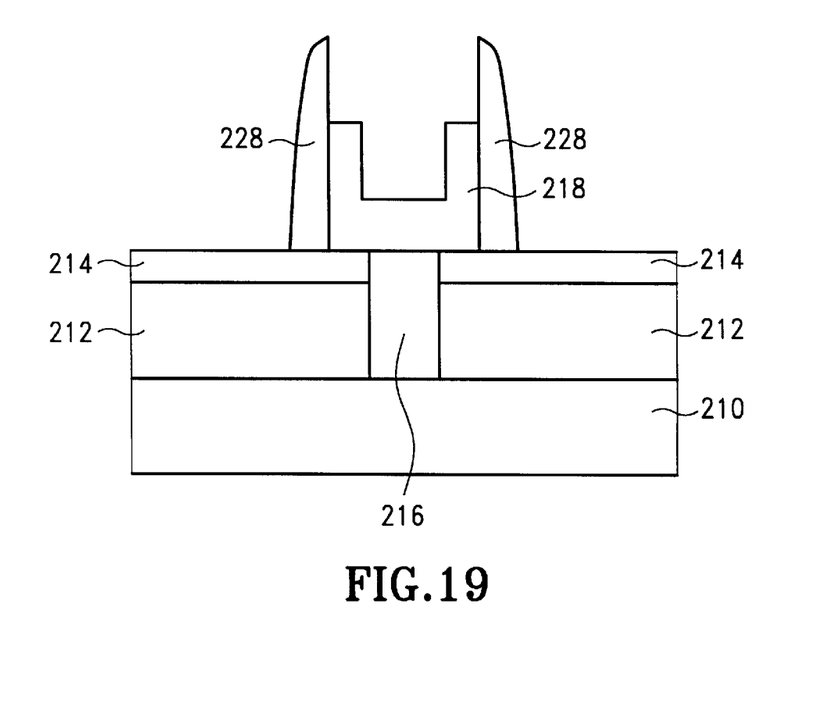

After removing the silicon nitride layer 226 and the silicon nitride spacer 222, for example, by hot phosphoric acid ($H_3PO_4$) solution, a double-crown shaped bottom electrode of the DRAM cell is thus formed as shown in FIG. 19.

Figure 20:
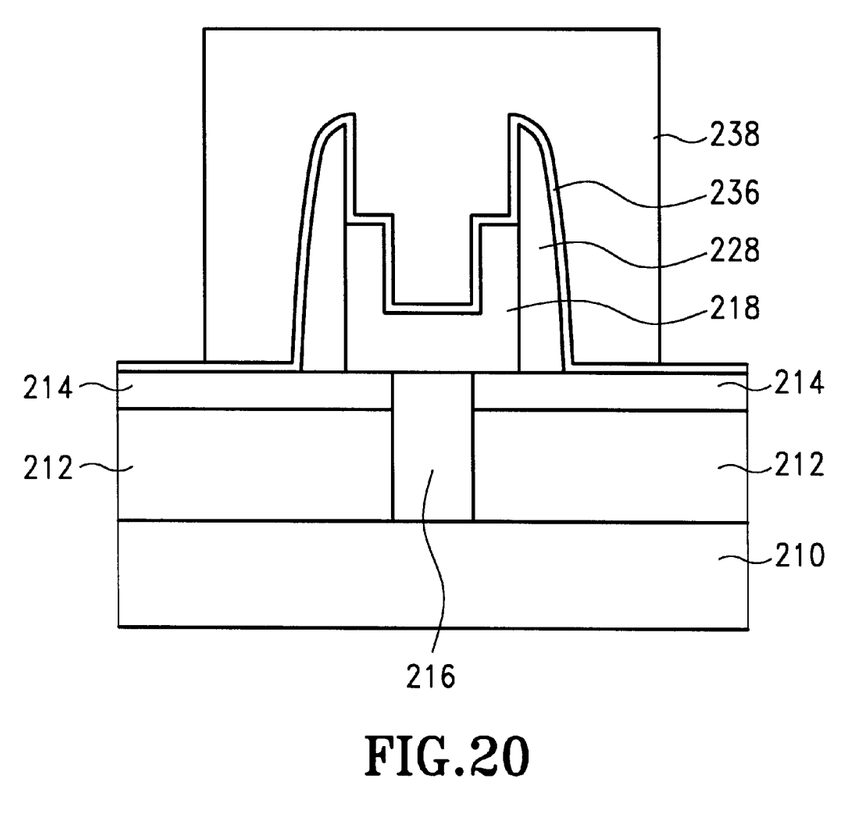

Referring to FIG. 20, a dielectric film 236 and a top electrode 238 of the DRAM cell capacitor can then be formed in the conventional manner. In this embodiment, a thin dielectric layer 236, such as stacked oxide-nitride-oxide (ONO) film, is formed on the exposed surface of the bottom electrode (i.e., the storage node 218 and 228) and the surface of the silicon oxide layer 214. As is known in the art of DRAM fabrication, the ONO film is reliable over shaped silicon surfaces, and is typically used as a capacitor insulator. The bottom oxide layer of the stacked oxide-nitride-oxide (ONO) film 236 is conventionally formed by thermally oxidizing the silicon surface, depositing an LPCVD silicon nitride layer and then oxidizing the silicon nitride layer to form the top oxide layer. Other material, such as NO, $Ta_2O_5$, $TiO_2$, PZT, PLZT, or BST can be used as the thin dielectric layer 136. As the dielectric layer 136 is formed of BST, the conductive layer 218 has to be formed of $RuO_2$. A conductive layer 238 is then deposited over the stack oxide/ silicon nitride/oxide layer 236 to serve as an upper plate of the DRAM cell capacitor. Typically, the conductive layer 238 is a doped polysilicon layer formed by using conventional process. Other material, such as metal or silicide, can be used as the conductive layer 238. In a case, the conductive layer 238 is formed of TiN, WN, Pt or W.

Although specific embodiments have been illustrated and described, it will be obvious to those skilled in the art that various modifications may be made without departing from the spirit which is intended to be limited solely by the appended claims.

What is claimed is:

1. A capacitor of a dynamic random access memory cell, said capacitor comprising:
    a first crown-shaped metal region formed over a semiconductor substrate, said first crown-shaped metal region communicating to said semiconductor substrate by using a conductive plug;
    a second crown-shaped metal region formed over said semiconductor substrate, an inner sidewall of said second crown-shaped metal region abutting on an outer sidewall of said first crown-shaped metal region, said second crown-shaped metal region being higher than said first crown-shaped metal region;
    a dielectric layer covering said first crown-shaped metal region and said second crown-shaped metal region; and
    a conductive layer formed on said dielectric layer.

2. The capacitor according to claim 1, further comprising a stack of a first silicon oxide layer and a second silicon oxide layer located between said second crown-shaped metal region and said semiconductor substrate.

3. The capacitor according to claim 2, wherein said first crown-shaped metal region communicates to said semiconductor substrate via a hole in said stack of the first silicon oxide layer and the second silicon oxide layer.

4. The capacitor according to claim 3, wherein said first silicon oxide layer comprises tetraethylorthosilicate (TEOS).

5. The capacitor according to claim 3, wherein said first silicon oxide layer comprises boro-phosphosilicate glass (BPSG).

6. The capacitor according to claim 1, wherein said dielectric layer comprises a material selected from the group consisting of ONO, NO, $Ta_2O_5$, $TiO_2$, PZT, PLZT, and BST.

7. The capacitor according to claim 1, wherein said conductive layer comprises a material selected from the group consisting of doped polysilicon, metal, and silicide.

8. The capacitor according to claim 1, wherein said first crown-shaped metal region is formed of material selected from a group consisting of W, WN and TiN.

9. The capacitor according to claim 1, wherein said second crown-shaped metal region is formed of material selected from a group consisting of W, WN and TiN.

10. The capacitor according to claim 1, wherein said conductive plug is formed of material selected from a group consisting of polysilicon and tungsten.

11. A capacitor of a dynamic random access memory cell, said capacitor comprising:
    a first dielectric layer formed on a semiconductor substrate;
    a silicon oxide layer formed on said first dielectric layer;
    a first crown-shaped metal region formed over said semiconductor substrate, said first crown-shaped metal region communicating to said semiconductor substrate via a hole in said first dielectric layer and said silicon oxide layer by using a conductive plug in said hole in said first dielectric layer and said silicon oxide layer;
    a second crown-shaped metal region formed over said silicon oxide layer, an inner sidewall of said second crown-shaped metal region abutting on an outer sidewall of said first crown-shaped metal region, said second crown-shaped metal region being higher than said first crown-shaped metal region;
    a second dielectric layer covering said first crown-shaped metal region and said second crown-shaped metal region; and
    a conductive layer formed on said second dielectric layer.

12. The capacitor according to claim 11, wherein said first dielectric layer comprises tetraethylorthosilicate (TEOS).

13. The capacitor according to claim 11, wherein said first dielectric layer comprises boro-phosphosilicate glass (BPSG).

14. The capacitor according to claim 11, wherein said second dielectric layer comprises a material selected from the group consisting of ONO, NO, $Ta_2O_5$, $TiO_2$, PZT, PLZT, and BST.

15. The capacitor according to claim 11, wherein said conductive layer comprises a material selected from the group consisting of doped polysilicon, metal, and silicide.

16. The capacitor according to claim 11, wherein said first crown-shaped metal region is formed of material selected from a group consisting of W, WN and TiN.

17. The capacitor according to claim 11, wherein said second crown-shaped metal region is formed of material selected from a group consisting of W, WN and TiN.

18. The capacitor according to claim 11, wherein said conductive plug is formed of material selected from a group consisting of polysilicon and tungsten.

* * * * *